United States Patent
Mueller et al.

(10) Patent No.: US 12,057,311 B2
(45) Date of Patent: Aug. 6, 2024

(54) METHOD FOR MANUFACTURING A SEMICONDUCTOR DEVICE USING A PATTERNED DIELECTRIC MASK AND SEMICONDUCTOR DEVICE

(71) Applicant: OSRAM Opto Semiconductors GmbH, Regensburg (DE)

(72) Inventors: Jens Mueller, Regensburg (DE); Adrian Stefan Avramescu, Regensburg (DE)

(73) Assignee: OSRAM OPTO SEMICONDUCTORS GMBH, Regensburg (DE)

(*) Notice: Subject to any disclaimer, the term of this patent is extended or adjusted under 35 U.S.C. 154(b) by 389 days.

(21) Appl. No.: 17/430,329

(22) PCT Filed: Feb. 12, 2020

(86) PCT No.: PCT/EP2020/053593
§ 371 (c)(1),
(2) Date: Aug. 12, 2021

(87) PCT Pub. No.: WO2020/165246
PCT Pub. Date: Aug. 20, 2020

(65) Prior Publication Data
US 2022/0115265 A1    Apr. 14, 2022

(30) Foreign Application Priority Data
Feb. 14, 2019    (DE) .............. 10 2019 103 756.5

(51) Int. Cl.
*H01L 21/02*    (2006.01)
*H01L 21/308*    (2006.01)
*H01L 21/768*    (2006.01)

(52) U.S. Cl.
CPC .. *H01L 21/02538* (2013.01); *H01L 21/02639* (2013.01); *H01L 21/3086* (2013.01); *H01L 21/76811* (2013.01)

(58) Field of Classification Search
CPC ......... H01L 21/02538; H01L 21/02639; H01L 21/3086; H01L 21/76811
See application file for complete search history.

(56) References Cited

U.S. PATENT DOCUMENTS

| 7,579,202 B2* | 8/2009 | Hsu | H01L 33/20 |
| | | | 438/33 |
| 10,217,660 B2* | 2/2019 | Sporer | H01L 21/84 |

(Continued)

FOREIGN PATENT DOCUMENTS

| DE | 10142656 A1 | 3/2003 |
| DE | 19838810 B4 | 2/2006 |

(Continued)

OTHER PUBLICATIONS

German Office Action issued for the corresponding German patent application No. 11 2020 000 802.9, dated Oct. 6, 2021, 10 pages (for informational purposes only).

(Continued)

*Primary Examiner* — Dale E Page
*Assistant Examiner* — Quovaunda Jefferson
(74) *Attorney, Agent, or Firm* — VIERING, JENTSCHURA & PARTNER mbB

(57) ABSTRACT

A method for manufacturing a semiconductor apparatus may include forming a patterned mask over a substrate, so that a first region of a first main surface of the substrate is covered by a plurality of spaced-apart sub-structural elements of a dielectric material, and second regions of the first main surface are not covered. Each of the plurality of sub-structural elements is arranged between adjacent second (Continued)

regions. The method also comprises carrying out a selective growth process of semiconductor material, so that the semiconductor material is grown over the second regions of the first main surface.

20 Claims, 11 Drawing Sheets

(56) References Cited

U.S. PATENT DOCUMENTS

| | | |
|---|---|---|
| 2004/0266157 A1 | 12/2004 | Bader et al. |
| 2018/0277391 A1 | 9/2018 | Friedler et al. |
| 2021/0226090 A1* | 7/2021 | Varghese .............. H01L 27/156 |

FOREIGN PATENT DOCUMENTS

| | | |
|---|---|---|
| DE | 102017106202 A1 | 9/2018 |
| EP | 0942459 A1 | 9/1999 |

OTHER PUBLICATIONS

German search report issued for the corresponding German patent application No. 10 2019 103 756.5, dated Sep. 24, 2019, 7 pages (for informational purposes only).
Inrernational search report issued for the corresponding international patent applicatopn No. PCT/EP2020/053593, dated May 20, 2020, 4 pages (for informational purposes only).

* cited by examiner

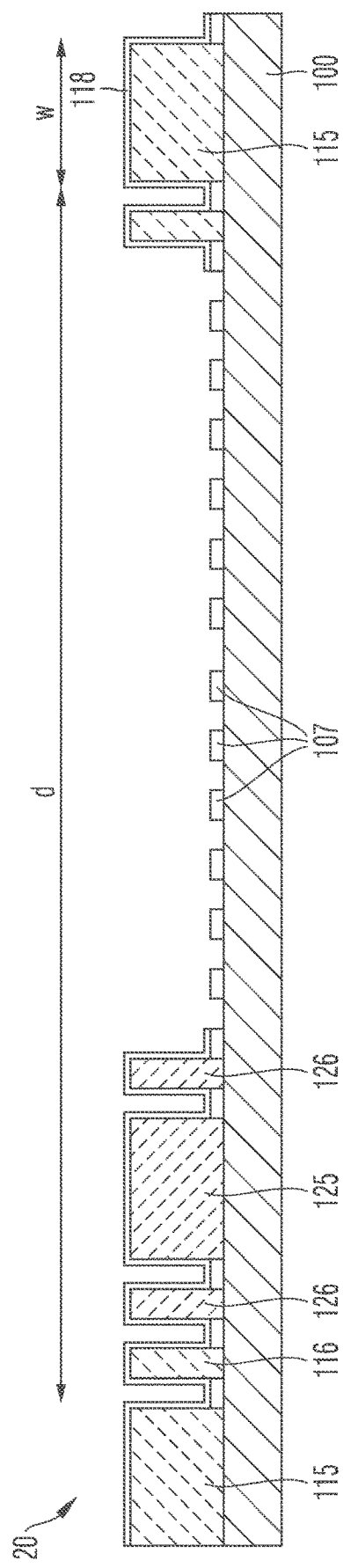

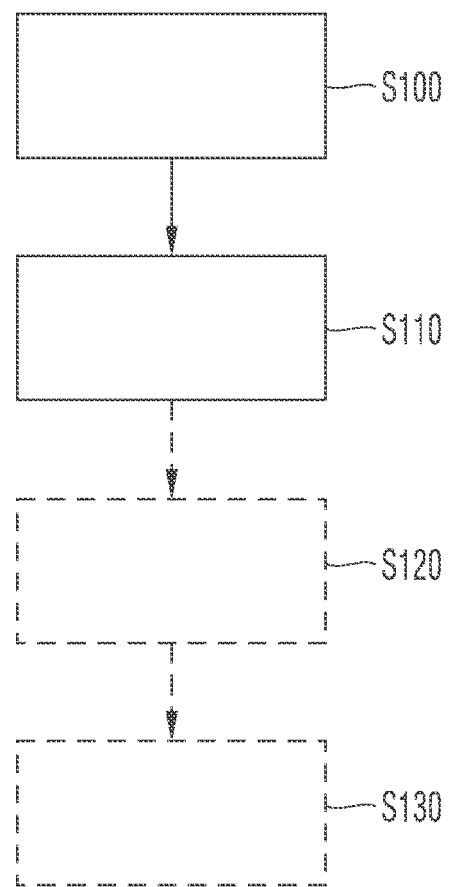

METHOD FOR MANUFACTURING A SEMICONDUCTOR DEVICE USING A PATTERNED DIELECTRIC MASK AND SEMICONDUCTOR DEVICE

CROSS-REFERENCE TO RELATED APPLICATIONS

The present application is a national stage entry according to 35 U.S.C. § 371 of PCT Application No. PCT/EP2020/053593 filed on Feb. 12, 2020; which claims priority to German Patent Application Serial No. 10 2019 103 756.5 filed on Feb. 14, 2019; all of which are incorporated herein by reference in their entirety and for all purposes.

TECHNICAL FIELD

The present invention relates to semiconductor devices having a plurality of epitaxially formed semiconductor regions where substructural elements comprising a dielectric material are arranged between two adjacent epitaxially formed semiconductor regions.

BACKGROUND

This patent application claims the priority of German patent application DE 10 2019 103 756.5, the disclosure contents of which are incorporated herein by reference.

In the manufacture of semiconductor devices in which monocrystalline semiconductor regions are arranged separately from one another on an insulating substrate, for example, problems may arise if the structure sizes are further reduced or the distances between the semiconductor regions are increased. Therefore, efforts are being made to provide manufacturing methods which allow for the monocrystalline semiconductor regions to be formed with as few defects as possible.

The objective is to provide an improved method for manufacturing a semiconductor device and an improved semiconductor device.

SUMMARY

A method of manufacturing a semiconductor device comprises forming a patterned mask over a substrate, so that a first region of a first main surface of the substrate is covered by a plurality of spaced-apart sub-structural elements of a dielectric material and second regions of the first main surface are not covered. The plurality of sub-structural elements is respectively arranged between adjacent second regions. The method further comprises performing a selective growth method of a semiconductor material, so that the semiconductor material is grown over the second regions of the first main surface.

For example, a lateral dimension of each of the second regions may be greater than a distance between adjacent sub-structural elements. Furthermore, according to embodiments, a lateral dimension of each of the second regions in a reference direction may be greater than a lateral dimension of the first region in the reference direction.

The sub-structural elements may be webs or portions of webs, for example. For example, a dimension of the first region is greater in a first direction than in a second direction. A longitudinal direction of the sub-structural elements may then correspond to the first direction.

For example, the second regions are respectively arranged in rows. Additionally or alternatively, the second regions may be arranged in columns.

For example, the sub-structural elements have a width of less than 2000 nm. The sub-structural elements may furthermore be spaced apart by more than 100 nm.

For example, the semiconductor material is also grown in the spaces between the sub-structural elements in the first region.

The method may further comprise forming an etching mask after performing the selective growth method, and performing an etching method to remove semiconductor material in the spaces between the sub-structural elements.

The method may furthermore comprise forming a passivation layer prior to forming the etching mask, the passivation layer being resistant to the etching process for removing semiconductor material from the spaces.

The semiconductor material may, for example, be a compound semiconductor material.

The method may further comprise epitaxially forming a second semiconductor layer in the first region.

A semiconductor device comprises a plurality of epitaxially formed semiconductor regions over a substrate, wherein sub-structural elements made of a dielectric material are arranged between two adjacent epitaxially formed semiconductor regions.

For example, a lateral dimension of each of the epitaxially formed semiconductor regions may be greater than a distance between adjacent sub-structural elements.

Furthermore, according to embodiments, a lateral dimension of each of the epitaxially formed semiconductor regions may be greater than a distance between adjacent epitaxially formed semiconductor regions.

The semiconductor device further comprises epitaxially grown semiconductor material between adjacent sub-structural elements.

For example, the semiconductor device is an optoelectronic semiconductor device, and the epitaxially formed semiconductor regions are pixels.

For example, the epitaxially formed semiconductor regions are arranged in rows.

The epitaxially formed semiconductor regions may also be arranged in rows and columns.

For example, the sub-structural elements are webs or portions of a web.

A dimension of the space between two epitaxially formed semiconductor regions may, for example, be greater in a first direction than in a second direction. A longitudinal direction of the sub-structural elements may correspond to the first direction.

A semiconductor apparatus comprises the semiconductor device described above. The semiconductor apparatus may be suitable for generating or receiving electromagnetic radiation. It may also be an integrated circuit, a transistor, or a power semiconductor apparatus.

BRIEF DESCRIPTION OF THE DRAWINGS

The accompanying drawings serve to provide an understanding of various embodiments. The drawings illustrate various embodiments and, together with the description, serve for explanation thereof. Further embodiments and many of the intended advantages will become apparent directly from the following detailed description. The elements and structures shown in the drawings are not neces

FIGS. 4A to 4C show cross-sectional views of a workpiece during performance of the method according to further embodiments.

FIG. 5 outlines a method according to the embodiment.

DETAILED DESCRIPTION

Figure 1A:
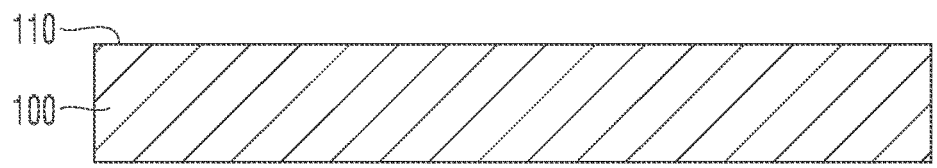
- FIGS. 1A and 1B illustrate cross-sectional views of a workpiece during performance of a method according to embodiments.

In the following detailed description, reference is made to the accompanying drawings, which form a part of the disclosure and in which specific exemplary embodiments are shown for purposes of illustration. In this context, directional terminology such as "top", "bottom", "front", "back", "over", "on", "in front", "behind", "leading", "trailing", etc. refers to the orientation of the figures just described. As the components of the exemplary embodiments may be positioned in different orientations, the directional terminology is used by way of explanation only and is in no way intended to be limiting.

The description of the exemplary embodiments is not limiting, since there are also other exemplary embodiments, and structural or logical changes may be made without departing from the scope as defined by the patent claims. In particular, elements of the exemplary embodiments described below may be combined with elements from others of the exemplary embodiments described, unless the context indicates otherwise.

The terms "lateral" and "horizontal", as used in the present description, are intended to describe an orientation or alignment which extends essentially parallel to a first surface of a semiconductor substrate or semiconductor body. This may be the surface of a wafer or a chip (die), for example.

The horizontal direction may, for example, be in a plane perpendicular to a direction of growth when layers are grown.

The term "vertical", as used in this description, is intended to describe an orientation which is essentially perpendicular to the first surface of a substrate or semiconductor body. The vertical direction may correspond, for example, to a direction of growth when layers are grown.

In the following, methods are described in which a layer of a first semiconductor material is grown on a growth substrate made of a second semiconductor material or of an insulating material, for example on a sapphire substrate. Further examples of materials for growth substrates include silicon, glass, quartz, GaAs, GaP or a ceramic, optionally with an additional growth or buffer layer. Growth layers may, for example, include materials that are similar to the materials to be grown. If, for example, GaN semiconductor material is grown, the growth layer may include GaN, AlN or AlGaN, for example. If GaP is grown, the growth layer may include GaP.

Depending on the intended use, the semiconductor may be based on a direct or an indirect semiconductor material. Examples of semiconductor materials particularly suitable for generating electromagnetic radiation include, without limitation, nitride semiconductor compounds by means of which, for example, ultraviolet, blue or longer-wave light may be generated, such as GaN, InGaN, AlN, AlGaN, AlGaInN, AlGaInBN, phosphide semiconductor compounds by means of which, for example, green or longer-wave light may be generated, such as GaAsP, AlGaInP, GaP, AlGaP, and other semiconductor materials such as GaAs, AlGaAs, InGaAs, AlInGaAs, SiC, ZnSe, ZnO, $Ga_2O_3$, diamond, hexagonal BN and combinations of the materials mentioned. The stoichiometric ratio of the compound semiconducot materials may vary. Other examples of semiconductor materials may include silicon, silicon germanium, and germanium.

The method described below may be applied to any semiconductor materials. In particular, the semiconductor layers grown may be used for any purpose. In particular, the use of the semiconductor layers deposited is not restricted to optoelectronic applications.

The term "substrate" generally includes insulating, conductive or semiconductor substrates.

To the extent used herein, the terms "have", "include", "comprise", and the like are open-ended terms that indicate the presence of said elements or features, but do not exclude the presence of further elements or features. The indefinite articles and the definite articles include both the plural and the singular, unless the context clearly indicates otherwise.

FIG. 1A shows a cross-sectional view of a substrate 100 which, for example, may be the starting point of the method described. The substrate may be a suitable growth substrate for semiconductor layers to be epitaxially grown thereon. If, for example, GaN-, GaAs- or GaP-containing semiconductor layers are to be grown subsequently, the substrate may, for example, be a sapphire substrate or a silicon substrate, each optionally comprising a suitable growth layer as described above. In general, materials are used for the substrate which may commonly be used for growing the materials described. A first main surface 110 denotes that main surface of the substrate 100 on which the semiconductor layer to be grown is to be grown.

Figure 1B:
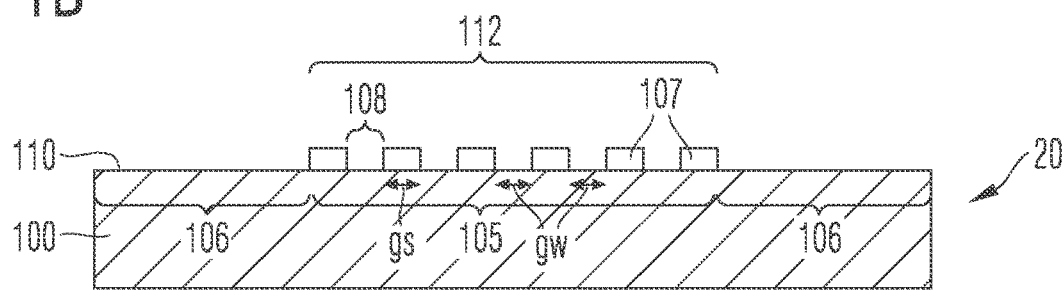

Then, as shown in FIG. 1B, a dielectric mask 112 is formed over the first main surface 110 of the substrate 100. The dielectric mask 112 constitutes a patterned dielectric mask which comprises a plurality of mutually adjacent sub-structural elements 107 made of a dielectric material. The sub-structural elements 107 may, for example, be webs, for example continuous or discontinuous webs. For example, the patterned dielectric mask 112 may be composed of $SiO_x$, $SiN_x$ or $SiON_x$, or combinations of these materials. A material of the dielectric mask 112 is suitable to prevent the growth of the layer to be grown on the substrate 100. For example, the patterned dielectric mask 112 may comprise a plurality of spaced-apart webs of the dielectric material.

The individual sub-structural elements 107 may each have a width gs of 1 to approximately 2000 nm. The sub-structural elements 107 may be spaced apart respectively by a distance gw. For example, gw may have a dimension of about 100 nm to 10 µm. For example, the distance gw may be greater than the distance gs. For example, the defect density can not be increased by selecting a greater distance gw. The smaller the width gs, the lower the defect density.

The first main surface 110 of the substrate 100 is thus divided into first regions 105 and second regions 106. The first regions 105 of the first main surface 110 are covered by a plurality of spaced-apart sub-structural elements made of the dielectric material. The second regions 106 of the first main surface 110 are not covered. Each of the plurality of spaced-apart sub-structural elements 107 is respectively arranged between two second regions 106. The sub-structural elements 107 may each have the same or different dimensions, for example in a horizontal direction perpendicular to the longitudinal direction. The distance between adjacent sub-structural elements 107 may in each case be the same or different.

Figure 1C:
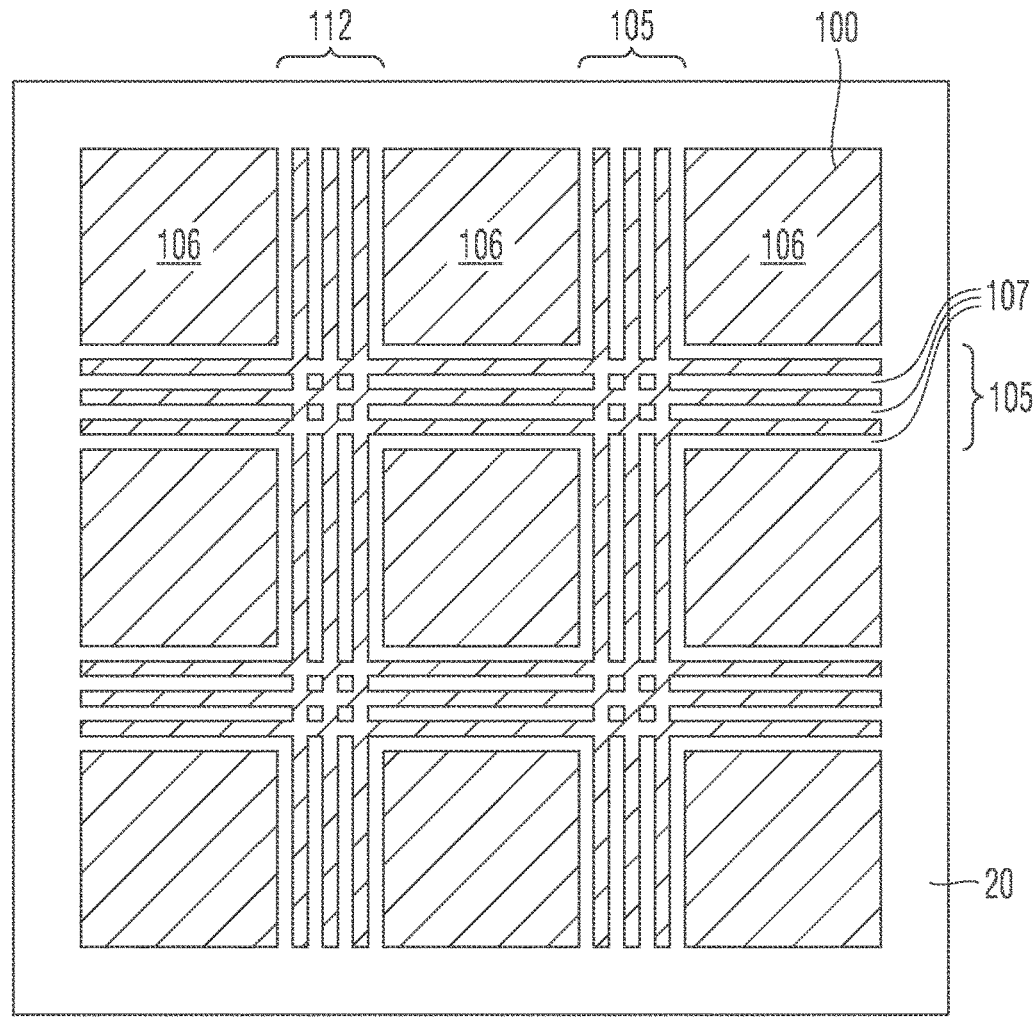
FIG. 1C shows a plan view of a part of a workpiece during performance of the method according to embodiments.

FIG. 1C shows a plan view of the workpiece 20. A plurality of second regions 106 is arranged on the first main surface 110 of the substrate 100. The individual second regions 106 are separated from one another by first regions 105. The first regions are not completely covered by a layer preventing epitaxial growth. Rather, this layer itself is patterned like a grid, for example, so that surface areas 108 between the webs or sub-structural elements 107 are exposed. The exposed surface areas, on which epitaxial growth may take place subsequently, have a width gw. Furthermore, the exposed surface areas 108 are separated from one another by a distance gs. According to further embodiments, the second regions 106 may each be subdivided, for example by further regions of a layer that prevents epitaxial growth.

The alignment of the sub-structural elements 107 is selected, for example, such that the sub-structural elements 107 subdivide the distance between adjacent second regions 106. For example, one dimension of the first regions 105, that is to say, of the spaces between two adjacent second regions 106, is respectively greater in a first direction than in a second direction. In this case, the webs or web portions extend in the first direction, and a longitudinal direction of the sub-structural elements corresponds to the first direction. If the second regions 106 are respectively arranged in rows, the sub-structural elements 107 respectively extend in the row direction between adjacent rows. If the second regions 106 are respectively arranged in columns, the sub-structural elements 107 respectively extend in the column direction between adjacent columns. If the second regions 106 are respectively arranged in rows and columns, the longitudinal direction of the sub-structural elements 107 corresponds to the column direction between adjacent columns and corresponds to the row direction between adjacent rows. According to further embodiments, the second regions 106 may also be arranged in rows that are offset from one another. For example, the longitudinal direction of the sub-structural elements 107 may correspond to the direction along which a delimitation of the second regions 106 extends. The sub-structural elements 107 may therefore extend parallel to a delimitation of adjacent second regions 106.

In general, a lateral dimension of each of the second regions 106 may be greater than a distance between adjacent sub-structural elements 107. Furthermore, a lateral dimension of each of the second regions in a reference direction may be greater than a lateral dimension of the first region 105 in the reference direction.

The shape of the second regions 106 may be any desired shape, for example the second regions 106 may be of a rectangular, square or other shape, for example hexagonal or triangular. Furthermore, the shape of each of the second regions may differ. The size of each of the second regions may also differ. The distance between adjacent second regions 106 may also differ in different directions or between different second regions 106.

A selective growth process for growing a semiconductor material is then carried out. The term "selective growth process" denotes a growth process in which growth takes place as a function of an underlying surface. More precisely, growth of the semiconductor layer 115, 116 takes place only in surface areas that are not covered by the sub-structural elements 107.

Figure 2:
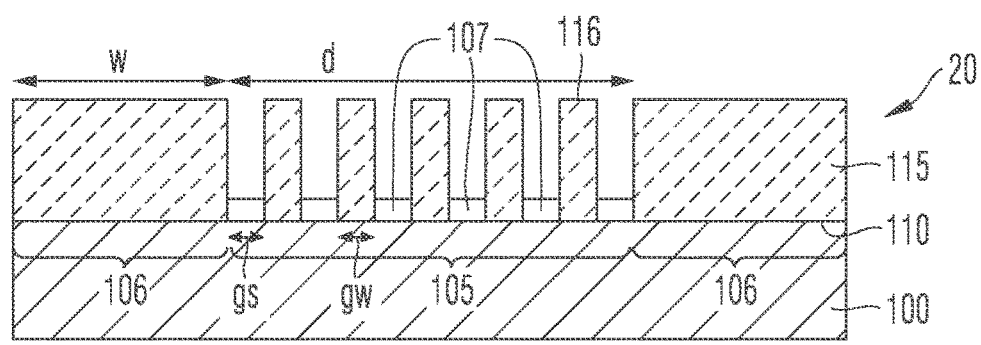
FIG. 2 shows a cross-sectional view of the workpiece after a further method step has been performed.

As a result, the workpiece 20 shown in FIG. 2 is obtained, for example. Semiconductor material 115 is epitaxially grown over each second region 106 to cover a large area. Furthermore, semiconductor material 116 is epitaxially grown between the sub-structural elements 107. As shown in FIG. 2, the epitaxially grown semiconductor material 115, 116 has a much greater layer thickness than the sub-structural elements 107. For example, the layer thickness of the grown semiconductor material 115, 116 may be greater than 2 µm. In contrast, the layer thickness of the sub-structural elements 107 may be less than 1 µm.

For example, the regions of the epitaxially grown semiconductor material 115 may each have a horizontal extension w over the second regions 106. In the case of an optoelectronic semiconductor device comprising a plurality of imaging elements or pixels, size w corresponds, for example, to the pixel width. The width of each of the grown semiconductor regions 115 may be in a range from 500 nm to approximately 5 µm or even greater. The individual regions of the epitaxially grown semiconductor material 115 may be spaced apart by a distance d. For example, d may be in a range from 100 nm to several 100 nm or in the µm range.

Figure 3A:
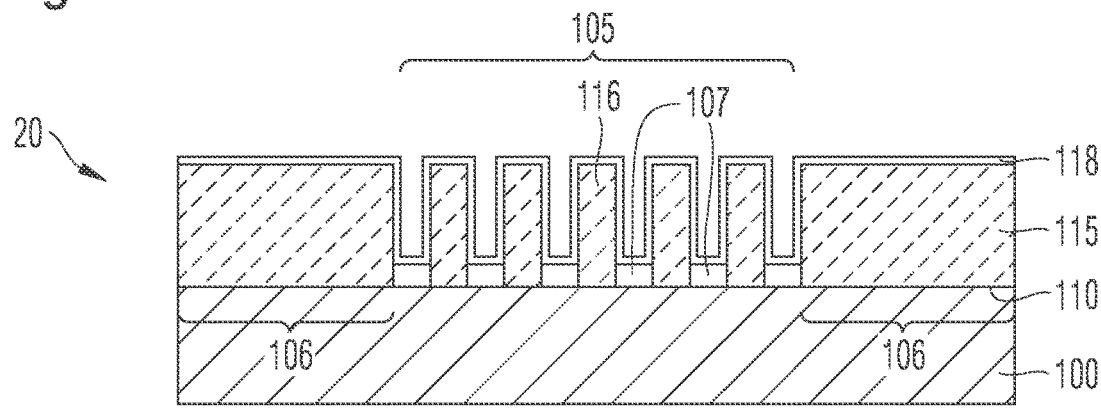
FIGS. 3A to 3E show cross-sectional views of a workpiece during performance of the method according to further embodiments.

As shown in FIG. 3A, a conformal dielectric passivation layer 118 may then be formed over the resulting surface. For example, the dielectric passivation layer may be applied by an ALD ("atomic layer deposition") process. For example, the conformal passivation layer 118 may contain one of the following materials: $AlO_x$, $SiO_x$, $TaO_x$, combinations of these materials, and others. The conformal passivation layer 118 thus covers both the epitaxially grown semiconductor material 115 and the semiconductor material 116, which is epitaxially grown in the spaces, as well as the surface of the sub-structural elements 107.

Figure 3B:
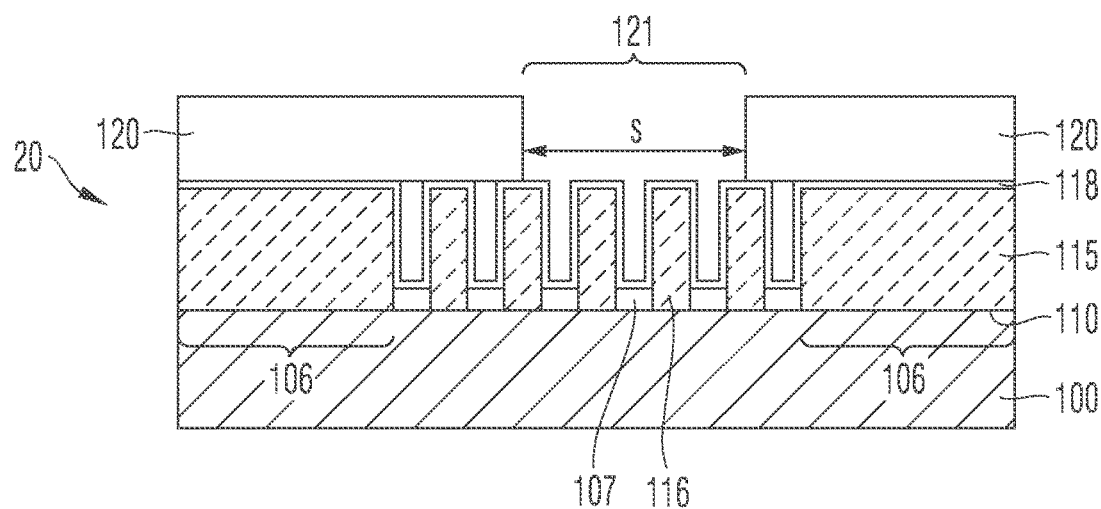

As shown in FIG. 3B, an etching mask may then be formed over the passivation layer 118. For example, the etching mask 120 may be composed of a photoresist material or another suitable material. The etching mask 120 is patterned to form mask openings 121. For example, the width s of the mask opening 121 may be smaller than the distance between the regions of the epitaxially grown semiconductor material 115 or than the width of the first region 105. The opening 121 of the etching mask 120 does not need to be precisely aligned with the first region 105 or the space between adjacent regions of the epitaxially grown semiconductor material 115. For example, one or more webs of the semiconductor material 116 epitaxially grown in the spaces may be arranged beneath the etching mask 120.

Next, for example, a dry etching process may be carried out, by means of which the epitaxially grown semiconductor material which is present in the region of the mask opening 121 is removed. For example, an inductively coupled (ICP) etching process or a reactive ion etching process (RIE) may be used as the dry etching process. For example, the etching processes may be fluorine- or chlorine-based.

Figure 3C:
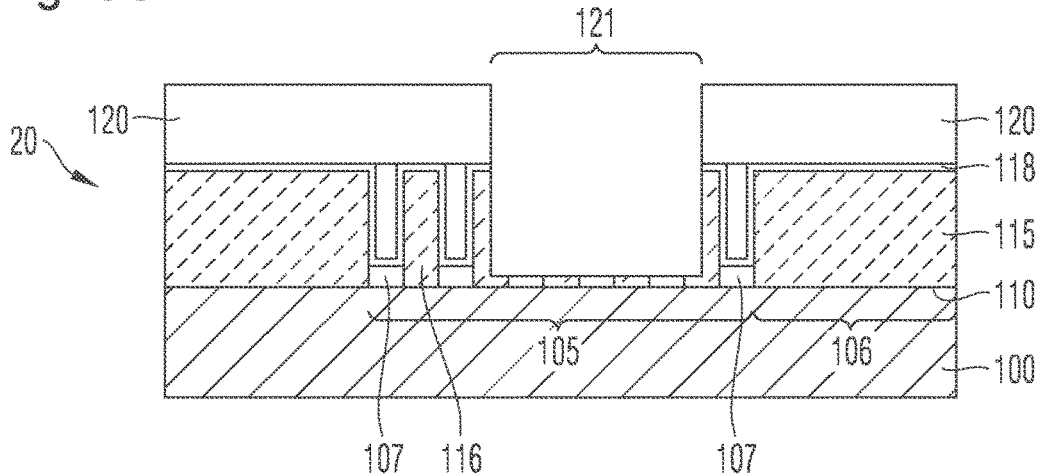

As shown in FIG. 3C, as a result, parts of the sub-structural elements 107 and also of the semiconductor material 116 epitaxially grown in the spaces are removed. Further parts of the epitaxially grown semiconductor material 116 and of the sub-structural elements 107 are present in the first region 105 between adjacent regions of the epitaxially grown semiconductor material 115. Since the edge of the epitaxially grown semiconductor material 115 is respectively covered by a passivation layer 118, the edges of this semiconductor material 115 are not damaged by the etching process. Consequently, fewer defects are generated on the structures 106, which, for example, may result in a reduction of non-radiative charge carrier recombination and thus to increased efficiency of the semiconductor device.

Figure 3D:
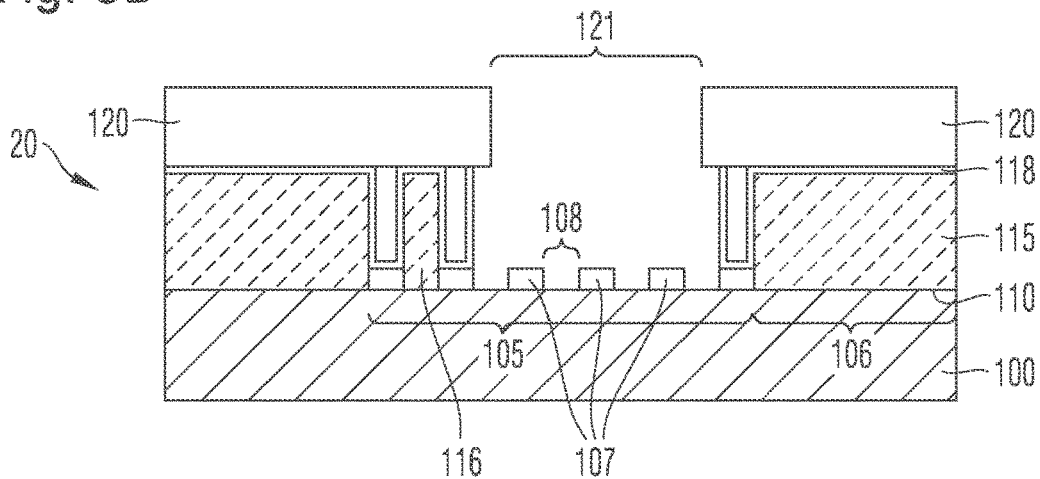

Then, as shown in FIG. 3D, a wet etching process may be performed. By means of this process, for example, the exposed regions of the epitaxially grown semiconductor material 116 are removed. This etching process may end, for example, on the surface of the sub-structural elements 107 and on the surface of the conformal passivation layer 118.

FIG. 3D shows an example of a resulting cross-sectional view. Sub-structural elements 107 are present between adjacent regions of the epitaxially grown semiconductor material 115. The etched-free region is respectively separated from the adjacent semiconductor material 115 by the conformal passivation layer 118. Due to the conformally deposited passivation layer 118, the etching process is thus limited for a wet etching process. As a result, it is possible to carry out this etching process as an "overetching process", that is to say, with a longer etching time, without the risk of the regions of the epitaxially grown semiconductor material 115 in the second region 106 being damaged or reduced in size.

Figure 3E:
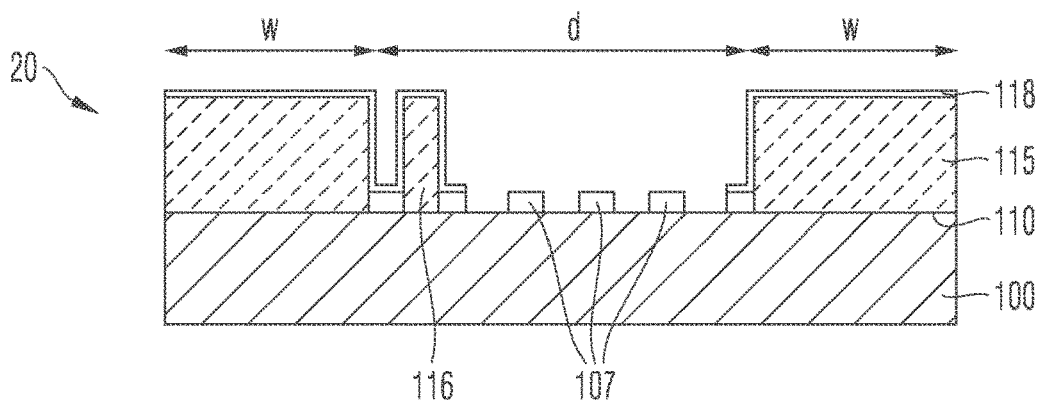

Subsequently, for example, a lift-off process for removing the remaining resist material may be carried out. This lift-off method may also be used to remove vertically free-standing regions of the passivation layer 118. Consequently, as illustrated in FIG. 3E, the regions of the epitaxially grown material 115 have a well-defined size w. For example, w may correspond to the pixel size in an optoelectronic semiconductor device. Moreover, the distance between the regions of the epitaxially grown semiconductor material 115 may have a value d which is increased in comparison to methods in which the dielectric mask comprises no sub-structural elements.

Figure 3F:
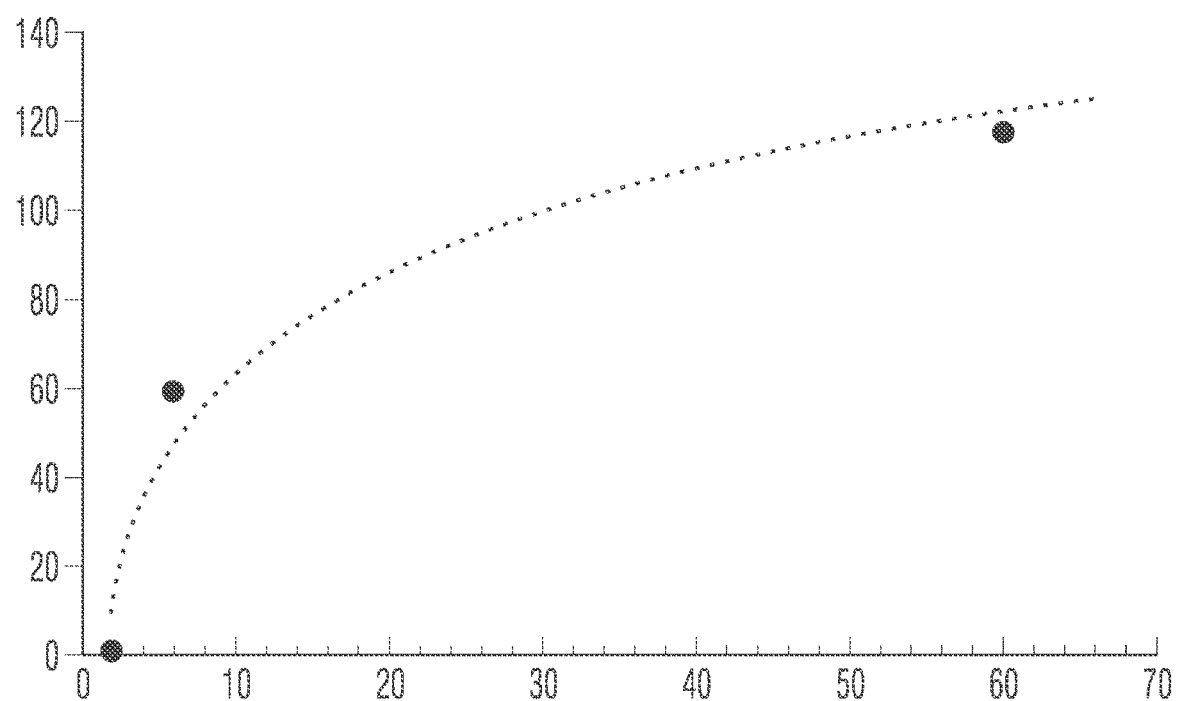
FIG. 3F shows a diagram of measuring results.

FIG. 3F illustrates the size of a defect region in μm in an epitaxially grown region as a function of a width of insulating regions between epitaxially grown areas in μm. The values were determined by photoluminescence measurement. Here, the x-axis denotes the width of insulating regions on the assumption that these are not patterned into sub-structural elements but are applied over the entire area. The defect region indicated as the y-axis of FIG. 3F indicates a horizontal extent, that is to say, an edge area, for example, within which defects may occur. As illustrated in FIG. 3F, when the width of the oxide regions is less than approximately 2 μm, larger defect regions may be avoided. Furthermore, even at a distance between the epitaxially grown regions that is smaller than 10 μm, a defect region of approximately 60 may occur, and correspondingly larger defect areas may occur at a greater distance.

This behavior may be explained by the fact that, with epitaxial growth, growth defects may occur more frequently at the pixel edges due to the changed flow behavior of the process gases used, if larger areas are covered with dielectric material between the second regions. Conversely, if the distance d between adjacent areas 115 is too small, for example less than 50 nm, the pixels may grow together or may no longer be processed in a simple manner later on in the chip process. Since, as described above, the first region 105 of the first main surface 110 of the substrate 100 is covered by a plurality of spaced-apart sub-structural elements of the electrical material, it is possible to suppress the growth defects and at the same time realize a comparatively large distance between the second regions 106. Accordingly, any distances between the second regions 106 may be set during performance of the method described, without the previously described negative effects occurring. When performing the method described, the distances between the second regions may thus be selected to be particularly large. For example, they may be selected to be so large that further epitaxial layers may be grown between the epitaxially grown regions of the material 115.

Figure 4A:
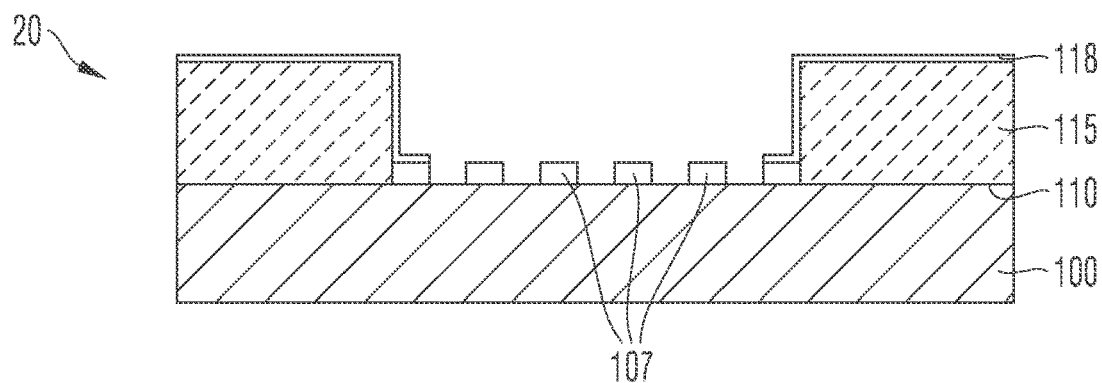
Figure 4B:
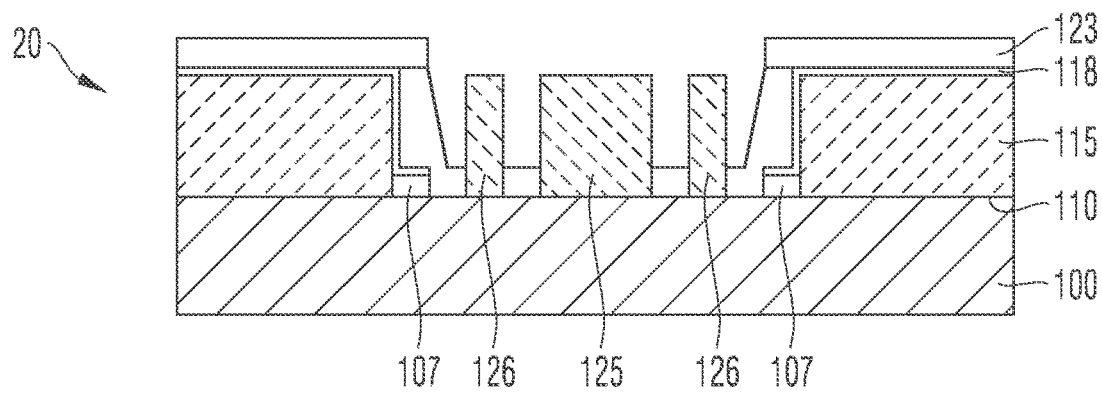

This is illustrated in more detail in FIGS. 4A to 4C. As shown in FIG. 4A, regions of the material 115 are arranged over the first main surface 110 of the substrate 100 at a corresponding distance from one another.

Starting from the structure shown in FIG. 4A, for example, residues of the sub-structural elements 107 may be removed by a dry etching process. A second passivation layer 123 is subsequently deposited over the resulting surface. For example, the second passivation layer 123 may include $SiO_x$, $SiN_x$ or a combination of these materials. The second passivation layer 123 is patterned again to form sub-structural elements. Then an epitaxial process takes place, as a result of which the second epitaxially grown semiconductor material 125 and further semiconductor material 126 is grown epitaxially in the spaces, as shown in FIG. 4B. For example, the second epitaxially grown semiconductor material 125 may be suitable to emit electromagnetic radiation of a different wavelength range than the first epitaxially grown semiconductor material 115. According to further embodiments, the second epitaxially grown semiconductor material 125 may be suitable as transistor or photodiode material.

FIG. 4C illustrates a cross-sectional view of a workpiece in which the distance d between adjacent regions of the semiconductor material 115 has been selected to be particularly large, i.e., in the order of magnitude of several (pixel) widths w. Here, after the second semiconductor material 125 has been applied, the distance to the right-hand semiconductor material 115 is dimensioned such that, for example, further semiconductor materials or other materials, for example metallic layers, may be applied. According to further embodiments, no further layer may be applied in this region, so that, from a macroscopic perspective, it appears transparent for the three colors red/green/blue, for example. This may be of interest for anti-reflection applications, for example.

FIG. 5 outlines a method according to embodiments. A method for forming a semiconductor device comprises forming (S100) a patterned mask over a substrate, so that a first region of a first main surface of the substrate is covered by a plurality of spaced-apart sub-structural elements of a dielectric material and second regions of the first main surface are not covered. A plurality of sub-structural elements is respectively arranged between adjacent second regions. The method further comprises performing (S110) a selective growth process of a semiconductor material so that the semiconductor material grows over the second region of the first main surface. For example, the selective growth process may be an epitaxial growth process. Examples include MOVPE (organometallic gas phase epitaxy) or MBE (molecular beam epitaxy) processes. For example, the grown material may be a compound semiconductor material that includes, for example, GaP, GaN or GaAs.

The method may further include forming (S120) an etching mask 120 after performing the selective growth method (S110), and performing an etching process (S130) for removing semiconductor material 116 in the spaces between the sub-structural elements 107.

In general, with compound semiconductor materials such as GaN or GaAs, it is difficult to pattern grown materials by etching in lateral dimensions smaller than 20 μm. More specifically, it is difficult with these materials to effect annealing of defects after an etching process has been performed. Therefore, a method in which may include initially covering surface areas over which no material is to be grown, followed by a selective epitaxial process.

Figure 6A:
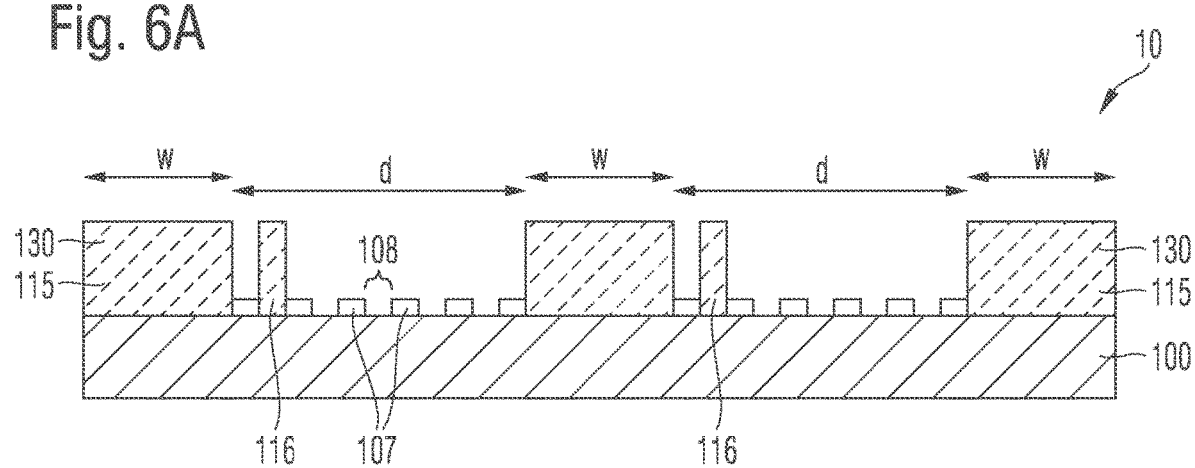
FIG. 6A shows a cross-sectional view of a semiconductor device according to embodiments.

FIG. 6A shows a cross-sectional view of a semiconductor device 10 according to embodiments. The semiconductor device 10 shown in FIG. 6A comprises a plurality of epitaxially formed semiconductor regions 130 over a substrate 100. A plurality of sub-structural elements 107 made of a dielectric material is respectively arranged between two adjacent epitaxially formed semiconductor regions 130. For example, webs of epitaxially grown semiconductor material 116 may be formed between adjacent sub-structural elements 107.

Figure 6B:
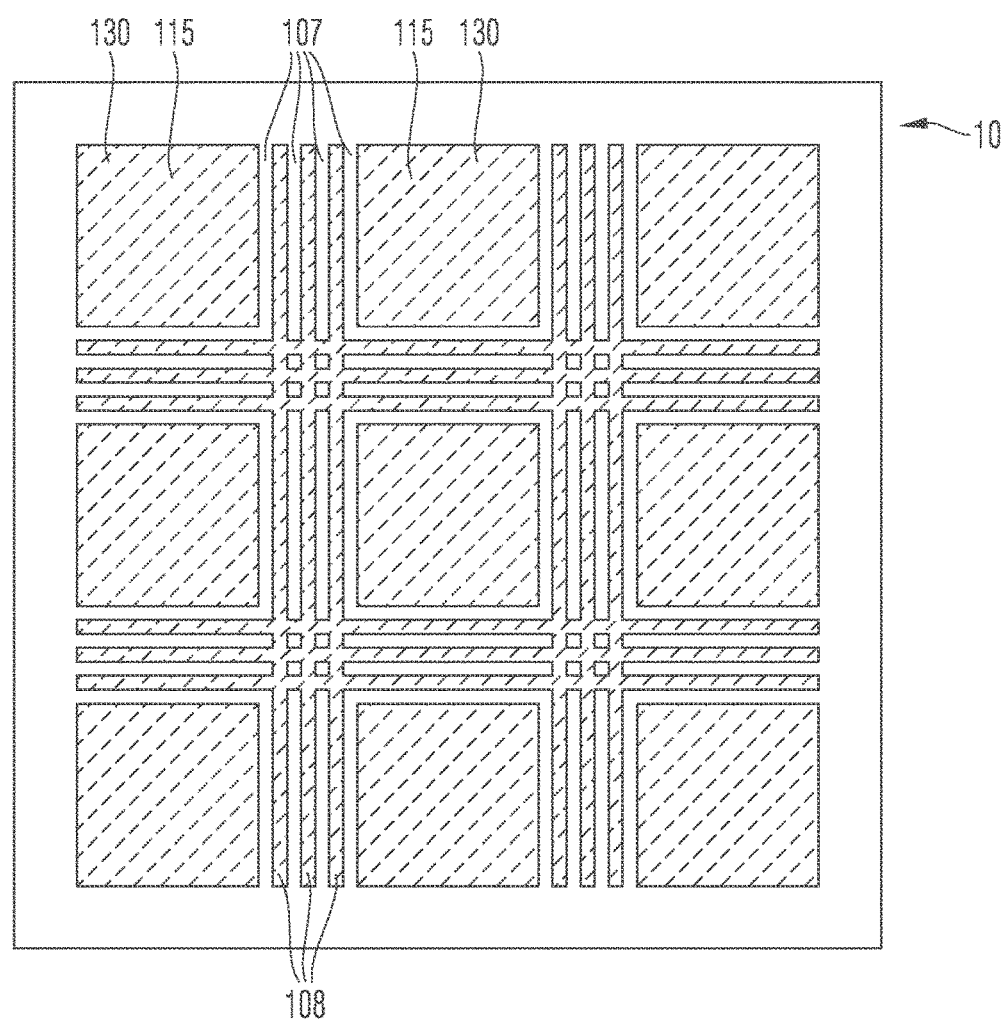
FIG. 6B shows a plan view of a semiconductor device according to embodiments.

FIG. 6B shows a plan view of a semiconductor device 10. Epitaxially formed semiconductor regions 130 are each separated from one another by sub-structural elements 107.

The epitaxially formed semiconductor regions 130 may, for example, be the previously described epitaxially grown semiconductor material 115. The epitaxially grown semiconductor regions 130 may, however, also be semiconductor material 116 epitaxially grown in spaces. The sub-structural elements 107 may be formed, for example, in the form of a web in the manner described above. The sub-structural elements 107 may, for example, be residues of the sub-structural elements 107 for forming the patterned dielectric mask 112. For example, epitaxially grown semiconductor regions 116 may be arranged between adjacent sub-structural elements 107. According to embodiments, a lateral dimension of each of the epitaxially formed semiconductor regions 130 may be greater than a distance between adjacent sub-structural elements 107. Furthermore, a lateral dimension of each of the epitaxially formed semiconductor regions 130 may be greater than a distance between adjacent epitaxially formed semiconductor regions.

For example, the semiconductor device may be an optoelectronic semiconductor device. The epitaxially formed semiconductor regions 130 may each represent pixels or imaging elements. The imaging elements or pixels may each be suitable for emitting or receiving electromagnetic radiation. Accordingly, the optoelectronic semiconductor device comprises a plurality of epitaxially formed semiconductor regions. The optoelectronic semiconductor device may for example comprise more than 25, for example more than 64 or more than 100 epitaxially formed semiconductor regions.

For example, a width w of the epitaxially formed semiconductor regions 130 may be greater than 5 or 10 μm or greater. A distance between adjacent epitaxially formed semiconductor regions 130d may be greater than 50 or 100 nm, for example. For example, the distance may be greater than 10 μm.

Figure 6C:
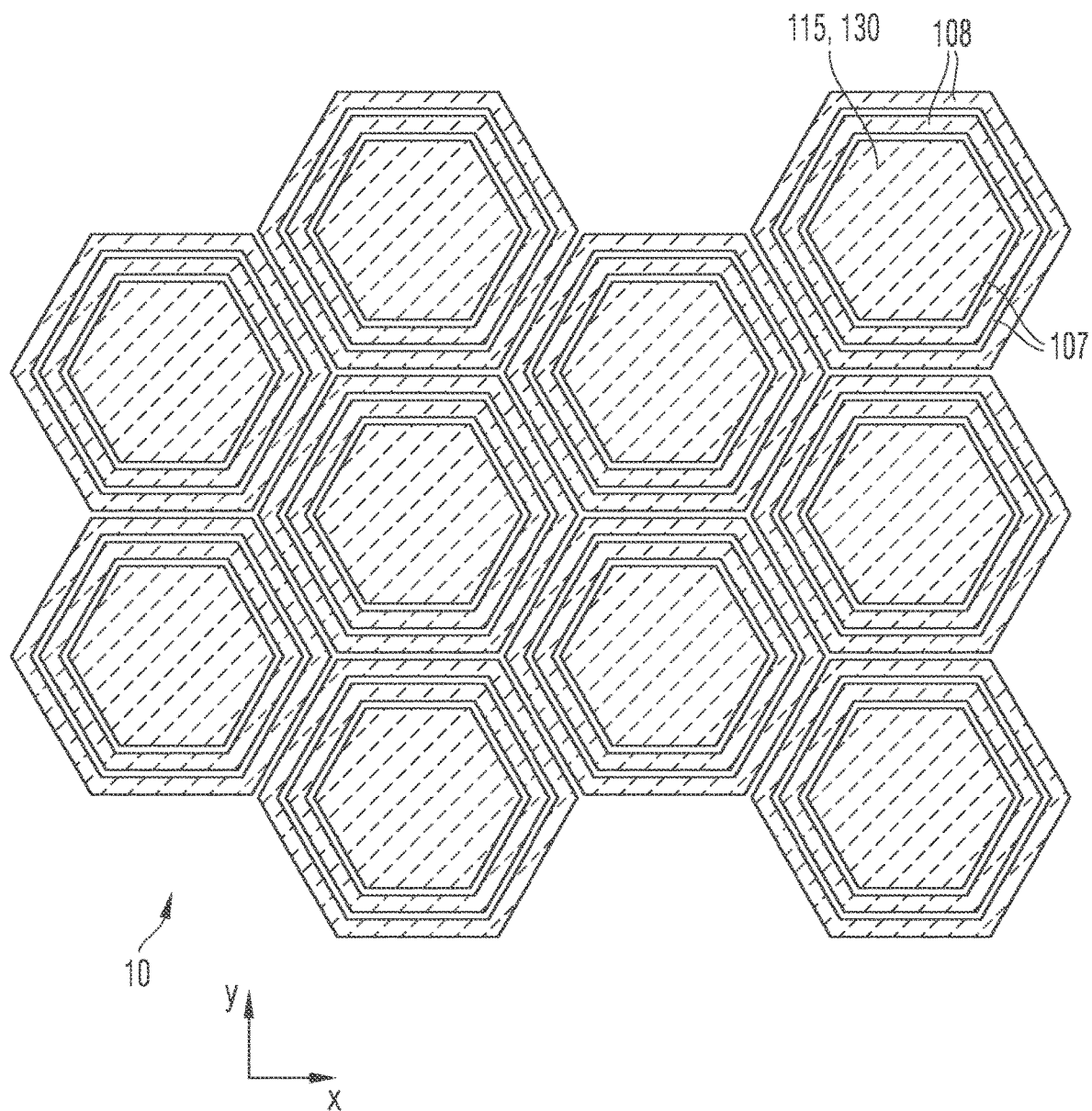
FIG. 6C shows a plan view of a semiconductor device according to further embodiments.

FIG. 6C shows a horizontal cross-sectional view of an optoelectronic semiconductor device in which the epitaxial semiconductor regions 130 each have a hexagonal shape and are thus adapted, for example, to the lattice structure of GaN. The epitaxially formed semiconductor regions 130 are respectively separated from one another by sub-structural elements 107. For example, the sub-structural elements 107 may respectively enclose the epitaxially formed semiconductor regions 130. The hexagonally shaped semiconductor regions 130 may be respectively arranged in columns offset from one another in the y-direction.

Figure 7:
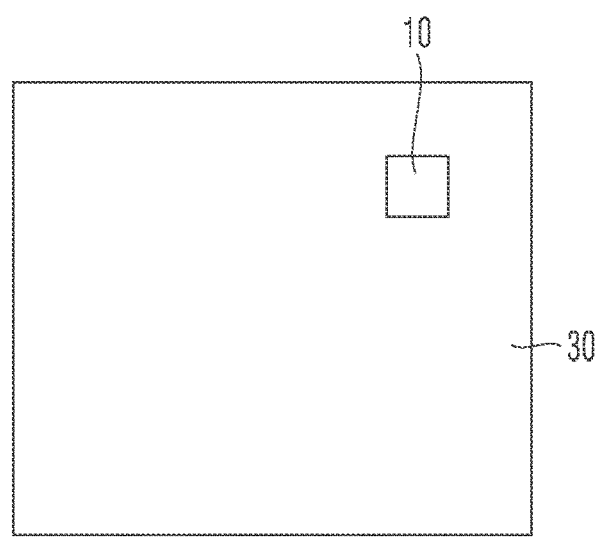
FIG. 7 shows a semiconductor apparatus according to embodiments.

FIG. 7 shows a semiconductor apparatus 30 comprising the semiconductor device 10 described herein. The semiconductor apparatus 30 may, for example, be an optical apparatus that is suitable for emitting and/or receiving electromagnetic radiation.

According to further embodiments, the semiconductor apparatus may be an integrated circuit or a transistor apparatus, which may be based, for example, on one of the compound semiconductor materials mentioned. For example, the semiconductor apparatus may be a power semiconductor apparatus.

Although specific embodiments have been illustrated and described herein, those skilled in the art will recognize that the specific embodiments shown and described may be replaced by a multiplicity of alternative and/or equivalent configurations without departing from the scope of the invention. The application is intended to cover any adaptations or variations of the specific embodiments discussed herein. Therefore, the invention is to be limited by the claims and their equivalents only.

LIST OF REFERENCES 10 semiconductor apparatus
20 workpiece
30 semiconductor apparatus
100 substrate
105 first region
106 second region
107 sub-structural element
108 exposed surface area
110 first main surface
112 dielectric mask
115 epitaxially grown semiconductor material
116 semiconductor material epitaxially grown in spaces
118 conformal passivation layer
120 etching mask
121 mask opening
123 second passivation layer
125 second epitaxially grown semiconductor material
126 semiconductor material epitaxially grown in spaces
130 epitaxially grown semiconductor region

The invention claimed is:

1. A method for manufacturing a semiconductor device comprising:
    forming a patterned mask over a substrate, the patterned mask comprising a plurality of sub-structural elements of a dielectric material, so that a first region of a first main surface of the substrate is covered by the plurality of spaced-apart sub-structural elements of a dielectric material and second regions of the first main surface are not covered, the plurality of sub-structural elements being respectively arranged between adjacent second regions;
    performing a selective growth method of a semiconductor material, so that the semiconductor material is grown over the second regions of the first main surface and in the spaces between the sub-structural elements in the first region;
    forming an etching mask after performing the selective growth process, the etching mask comprising an opening, wherein a portion of the semiconductor material is arranged below the opening so as to overlap with the opening, and performing an etching process to remove semiconductor material from the spaces between the sub-structural elements below the opening.

2. The method according to claim 1, wherein a lateral dimension of each of the second regions is greater than a distance between adjacent sub-structural elements.

3. The method according to claim 1, wherein a lateral dimension of each of the second regions in a reference direction is greater than a lateral dimension of the first region in the reference direction.

4. The method according to claim 1, wherein the sub-structural elements are webs or portions of a web.

5. The method according to claim 4, wherein a dimension of the first region is greater in a first direction than in a second direction and a longitudinal direction of the sub-structural elements corresponds to the first direction.

6. The method according to claim 1, wherein the second regions are respectively arranged in rows.

7. The method according to claim 1, wherein the second regions are arranged in columns.

8. The method according to claim 1, wherein the sub-structural elements have a width of less than 2000 nm.

9. The method according to claim 1, wherein the sub-structural elements are spaced apart by more than 100 nm.

10. The method according to claim 1, further comprising forming a passivation layer prior to forming the etching mask, the passivation layer being resistant to the etching process for removing semiconductor material from the spaces.

11. The method according to claim 1, further comprising epitaxially forming a second semiconductor layer in the first region.

12. A semiconductor device comprising a plurality of epitaxially formed semiconductor regions over a substrate, wherein sub-structural elements made of a dielectric material are arranged between two adjacent epitaxially formed semiconductor regions, wherein epitaxially formed semiconductor material is absent from spaces between adjacent sub-structural elements and and epitaxially formed semiconductor material does not overlap with the sub-structural elements.

13. The semiconductor apparatus according to claim 12, wherein a lateral dimension of each of the epitaxially formed semiconductor regions is greater than a distance between adjacent sub-structural elements.

14. The semiconductor apparatus according to claim 12, wherein a lateral dimension of each of the epitaxially formed semiconductor regions is greater than a distance between adjacent epitaxially formed semiconductor regions.

15. The semiconductor device according to claim 12, wherein the semiconductor device is an optoelectronic semiconductor device and the epitaxially formed semiconductor regions are pixels.

16. The semiconductor device according to claim 12, wherein the epitaxially formed semiconductor regions are arranged in rows.

17. The semiconductor device according to claim 12, wherein the epitaxially formed semiconductor regions are arranged in rows and columns.

18. The semiconductor device according to claim 12, wherein the sub-structural elements are webs or portions of a web.

19. The semiconductor device according to claim 18, wherein a dimension of a space between two epitaxially formed semiconductor regions is greater in a first direction than in a second direction and a longitudinal direction of the sub-structural elements corresponds to the first direction.

20. A semiconductor apparatus comprising the semiconductor apparatus according to claim 12.

* * * * *